United States Patent
Chuang

(10) Patent No.: US 10,475,516 B2
(45) Date of Patent: Nov. 12, 2019

(54) DATA STORAGE DEVICE AND DATA ERASING METHOD WHEREIN AFTER ERASING PROCESS, PREDETERMINED VALUE IS WRITTEN TO INDICATE COMPLETION OF SAID ERASING METHOD

(71) Applicant: Silicon Motion, Inc., Jhubei, Hsinchu County (TW)

(72) Inventor: Chia-Hao Chuang, Jhubei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 322 days.

(21) Appl. No.: 14/499,511

(22) Filed: Sep. 29, 2014

(65) Prior Publication Data
US 2015/0161040 A1 Jun. 11, 2015

(30) Foreign Application Priority Data
Dec. 9, 2013 (TW) .............................. 102145062 A

(51) Int. Cl.
G06F 16/16 (2019.01)
G06F 12/02 (2006.01)
G11C 16/16 (2006.01)

(52) U.S. Cl.
CPC .......... *G11C 16/16* (2013.01); *G06F 12/0246* (2013.01); *G06F 2212/7201* (2013.01)

(58) Field of Classification Search
CPC combination set(s) only.
See application file for complete search history.

(56) References Cited

U.S. PATENT DOCUMENTS 6,131,131 A * 10/2000 Bassman ............. G06F 13/4059
710/15
6,144,607 A 11/2000 Sassa
7,203,140 B2 4/2007 Haga
(Continued)

FOREIGN PATENT DOCUMENTS

CN 1206149 A 1/1999
CN 102004706 A 4/2011

OTHER PUBLICATIONS

"MagicRAM", Web page <http://www.magicram.com/magicram-now-offers-hardware-triggered-secure-erase-wp-switch-for-ssd>, May 8, 2012, retrieved from Internet Archive Wayback Machine <https://web.archive.org/web/20120508023739/http://www.magicram.com/magicram-now-offers-hardware-triggered-secure-erase-wp-switch-for-ssd> on Jan. 14, 2016.*

*Primary Examiner* — Baboucarr Faal
*Assistant Examiner* — Chie Yew
(74) *Attorney, Agent, or Firm* — McClure, Qualey & Rodack, LLP

(57) ABSTRACT

The present invention provides a data-storage device. The data-storage device includes a flash memory and a controller. The flash memory includes a plurality of blocks, and each of the blocks includes a plurality of pages. The controller is arranged to receive an erase signal from a host, and enable the flash memory to sequentially execute an erasing process on at least one first block of the blocks in response to the erase signal, wherein a specific page of the first block has been written by a predetermined value and the other pages of the first block in exception to the specific page have been erased after the erasing process executed on the first block is completed.

13 Claims, 3 Drawing Sheets

(56) References Cited

U.S. PATENT DOCUMENTS

| | | | |
|---|---|---|---|
| 2003/0161186 A1* | 8/2003 | Aasheim | G06F 12/0246 365/185.29 |
| 2003/0225962 A1† | 12/2003 | Hirosawa | |
| 2005/0102466 A1* | 5/2005 | Chen | G06F 11/1068 711/103 |
| 2006/0155917 A1* | 7/2006 | Di Sena | G06F 12/0246 711/103 |
| 2008/0239851 A1† | 10/2008 | Lin | |
| 2009/0049229 A1† | 2/2009 | Honda | |
| 2009/0077306 A1* | 3/2009 | Arcedera | G06F 12/0246 711/103 |
| 2009/0125670 A1* | 5/2009 | Keays | G06F 12/0246 711/103 |
| 2009/0201734 A1* | 8/2009 | Salessi | G11C 16/16 365/185.11 |
| 2009/0225611 A1* | 9/2009 | Cha | G11C 29/1201 365/201 |
| 2010/0165748 A1* | 7/2010 | Thiruvengadam | G11C 8/06 365/185.33 |
| 2012/0005557 A1* | 1/2012 | Mardiks | G06F 11/10 714/763 |
| 2012/0033493 A1* | 2/2012 | Thiruvengadam | G11C 8/06 365/185.03 |
| 2012/0060054 A1* | 3/2012 | Sun | G06F 12/0246 714/6.13 |
| 2012/0300554 A1 | 11/2012 | Goss et al. | |
| 2013/0080685 A1* | 3/2013 | Park | G06F 3/0608 711/103 |

\* cited by examiner
† cited by third party

DATA STORAGE DEVICE AND DATA ERASING METHOD WHEREIN AFTER ERASING PROCESS, PREDETERMINED VALUE IS WRITTEN TO INDICATE COMPLETION OF SAID ERASING METHOD

CROSS REFERENCE TO RELATED APPLICATIONS

This Application claims priority of Taiwan Patent Application No. 102145062, filed on Dec. 9, 2013, the entirety of which is incorporated by reference herein.

BACKGROUND OF THE INVENTION

Field of the Invention

The present invention relates to a data-storage device and in particular to a data-storage device capable of shortening the time required for erasing.

Description of the Related Art

Flash memory is considered a non-volatile data-storage device, using electrical methods to erase and program itself. Taking NAND Flash as an example, it is often used as a memory card, USB flash device, solid state device, eMMC and other memory devices.

The flash memory includes a plurality of blocks and each of the blocks has a plurality of pages arranged to store data. The flash memory is erased by block and stored by page. When the flash memory receives a command to erase all of the blocks, the flash memory will erase each of the pages of each of the blocks, sequentially. However, it takes a long time to perform the erase process on each of the pages, causing usage and compiling difficulties for program developers and users alike.

BRIEF SUMMARY OF THE INVENTION

A detailed description is given in the following embodiments with reference to the accompanying drawings.

The present invention provides a data-storage device. The data-storage device includes a flash memory and a controller. The flash memory includes a plurality of blocks, and each of the blocks includes a plurality of pages. The controller is arranged to receive an erase signal from a host and enable the flash memory to sequentially execute an erasing process on at least one first block of the blocks in response to the erase signal, wherein a specific page of the first block has been written by a predetermined value and the other pages of the first block in exception to the specific page have been erased after the erasing process executed on the first block is completed.

The present invention further provides a data erasing method applied to a data-storage device, wherein the data-storage device includes a flash memory, and the flash memory includes a plurality of blocks. The data erasing method includes: erasing data of a first block of the blocks in response to an erase signal; and writing a predetermined value to a specific page of the pages of the first block after all of the pages of the first block have been erased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
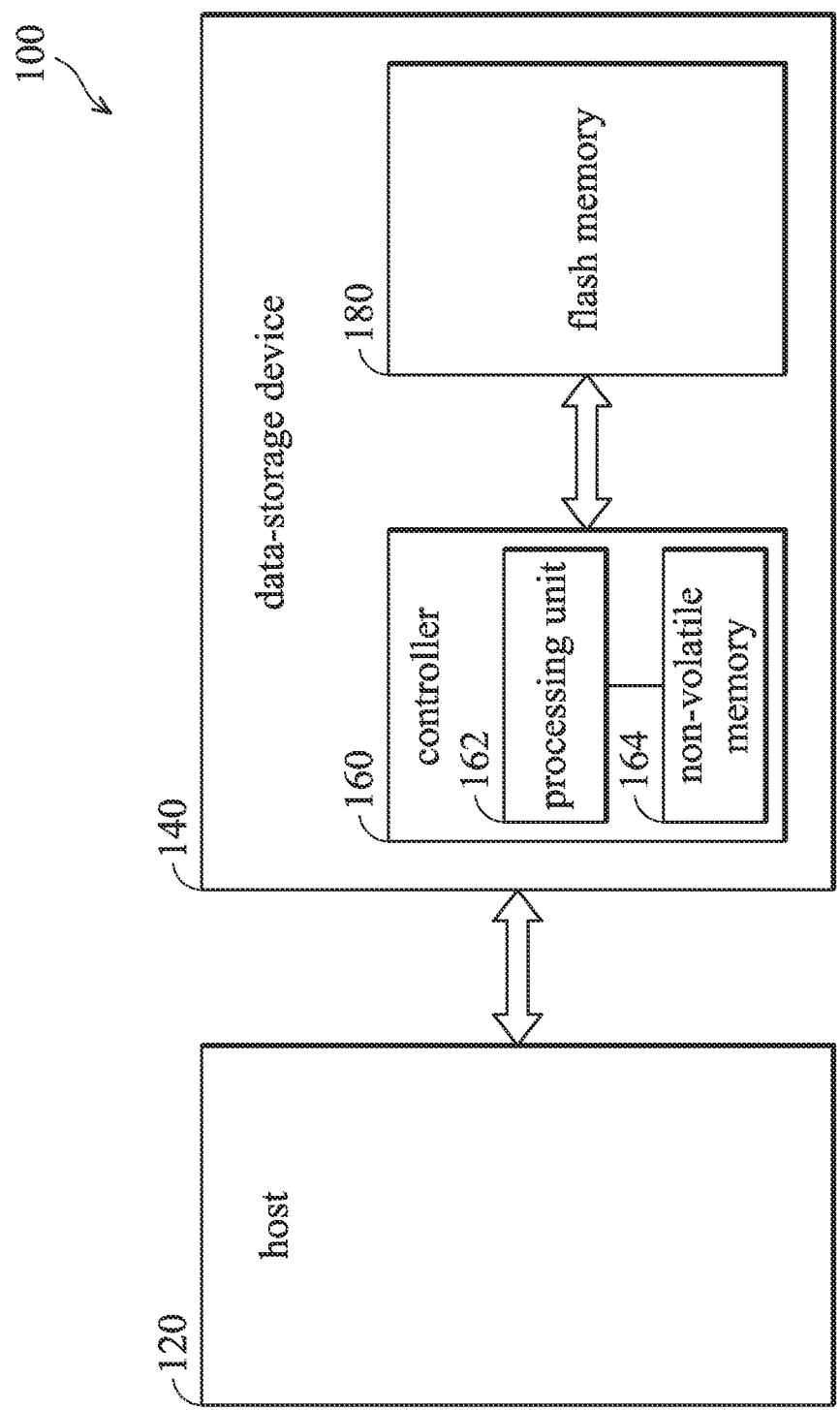
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data-storage device 140. The data-storage device 140 includes a flash memory 180 and a controller 160 arranged to operate in response to the commands of the host 110. The controller 160 includes a processing unit 162 and a non-volatile memory, such as read only memory (ROM) 164. The non-volatile memory 164, the program code stored in the non-volatile memory 164 and data stored in the non-volatile memory 164 constitute a firmware performed by the processing unit 162, and the controller 160 is configured to control the flash memory 180 base on the firmware. The flash memory 180 includes a plurality of blocks, and each of the blocks includes a plurality of pages.

Moreover, each of the pages of each of the blocks has a logical address and a physical address, and the data-storage device 140 further includes a mapping table arranged to store the corresponding relationships between the logical addresses and the physical addresses of the pages. For example, the mapping table may be stored in the non-volatile memory 164. Moreover, the mapping table may include at least one block mapping table and a plurality of page mapping tables. For example, the controller 160 may obtain the logical block and the logical page according to the corresponding logical address, and locate the physical block corresponding to the logical block according to the block mapping table. Next, the controller 160 may locate the physical page corresponding to the logical page according to the page mapping table corresponding to the logical block, but it is not limited thereto. The tables which are capable of locating the physical address of the logical address of pages are the scope of the present invention.

In one of the embodiments of the present invention, the controller 160 is arranged to receive an erase signal, and it enables the flash memory 180 to execute an erasing process on at least one block in response to the erase signal. It should be noted that the erase signal may be a purge command, or an enhanced erase command specified by the ATA specification (Working Draft Project American National T13/2015-D Standard), but it is not limited thereto. In another embodiment of the present invention, the erase signal may be produced by a hardware switch. In one of the embodiments, the erase signal may further include a predetermined value arranged to be written to the flash memory 180. For example, the predetermined value can be "0x21", but it is not limited thereto.

Figure 2:
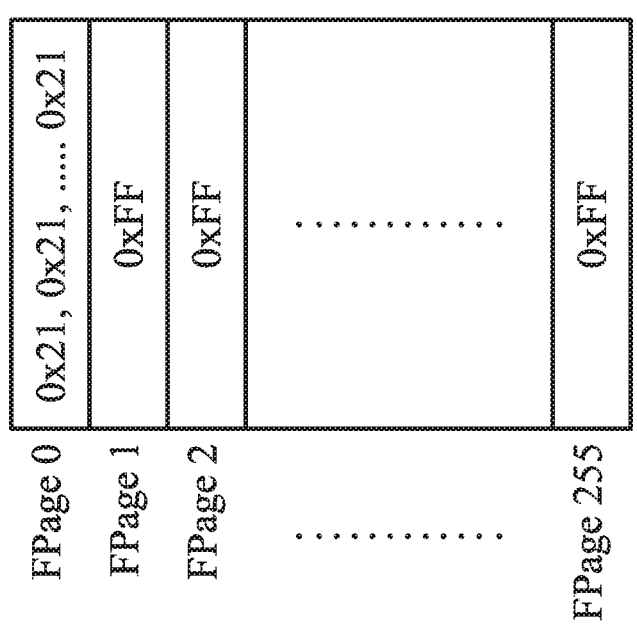
FIG. 2 is a schematic diagram illustrating an embodiment of physical page of the present invention.

In the erasing process, the controller 160 erases each of the pages of the block, and writes a predetermined value into a specific page of the block, as shown in FIG. 2. It should be noted that the specific page may be the first page on the top of the block, or any other page of the block, but it is not limited thereto. FIG. 2 is a schematic diagram illustrating an embodiment of a physical page of the present invention, wherein FIG. 2 shows the physical pages FPage0-FPage255 of a first block. As shown in FIG. 2, only the specific page FPage0 of the first block has been written with the predetermined value "0x21", and the other pages FPage1-FPage255 of the first block have been erased, wherein the value of the pages which have been erased is "0xFF", but it is not limited thereto.

In other embodiments of the present invention, the controller 160 is configured to write the predetermined value into a plurality of specific pages of the erased block after erasing the block in response to the erase signal. For example, the controller 160 may write the predetermined value into the even pages, the odd pages, or the first and last pages, but it is not limited thereto.

Figure 3:
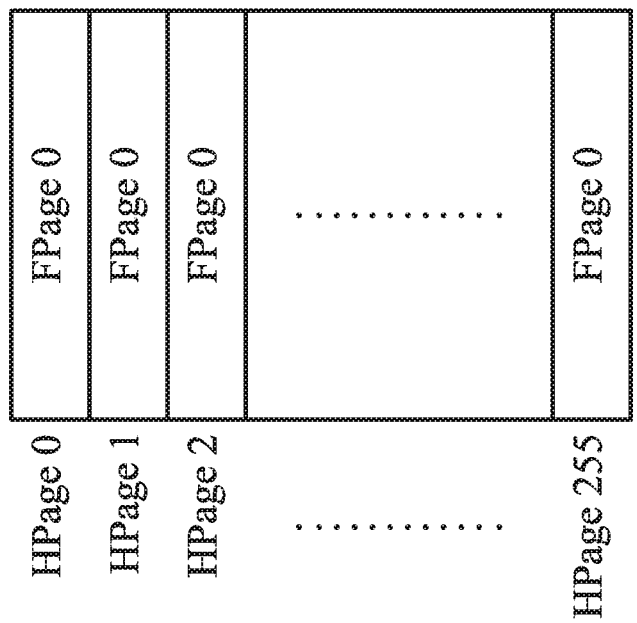
FIG. 3 is a schematic diagram illustrating an embodiment of mapping table of the present invention.

The controller 160 updates the mapping table for mapping the logical addresses of the other pages in exception to the specific page to the physical address of the specific page after the erasing process executed on the flash memory 180 is completed. Namely, all of the logical addresses of the pages in the erased block are mapped to the physical address of the specific page, as shown in FIG. 3. FIG. 3 is a schematic diagram illustrating an embodiment of mapping table of the present invention, wherein FIG. 3 shows the page mapping table of a first block of the blocks. As shown in FIG. 3, all of the logical addresses HPage0-HPage255 of the pages in the first block are mapped to the physical address FPage0 of the specific page, but it is not limited thereto. For example, the number of the pages can be greater or less than 256.

Moreover, the controller 160 erases the data of the first block of the flash memory 180 after receiving the erase signal, and writes the predetermined value into a specific page of the first block. Next, the controller 160 rewrites the mapping table to map the logical addresses of the pages in the first block to the physical address of the specific page. Next, the controller 160 is further configured to erase the data of a second block of the flash memory 180, and write the predetermined value into a specific page of the second block. Next, the controller 160 rewrites the mapping table to map the logical addresses of all of the pages in the second block to the physical address of the specific page after the predetermined value has been written into the specific page of the second block, and so on. The controller 160 repeats the step of erasing data, writing the predetermined value, and rewriting the mapping table until all of the blocks of the flash memory 180 are erased, the predetermined value has been written into the specific pages of each of the blocks and all of the logical addresses of the pages are mapping to the physical address of the corresponding specific page.

Namely, the specific pages of all of the blocks have been written by the predetermined value and other pages of the blocks have been erased after the erasing process executed on the flash memory 180 is completed. Moreover, the logical addresses of all the pages of all the blocks in the mapping table are mapping to the physical address of the corresponding specific page of the corresponding block. Therefore, the host 120 may read the flash memory 180, and determine that the erasing process is completed according to the predetermined value read out from the pages of the flash memory 180. Namely, the data read out from each of the pages of each of the blocks are the predetermined value when the host 120 reads the flash memory 180 after the erasing process, therefore the flash memory 180 determines that the erasing process is completed. However, in the present invention, only the specific pages of the flash memory 180 have been written by the predetermined value. Therefore, the present invention shortens the time of the erasing process.

Figure 4:
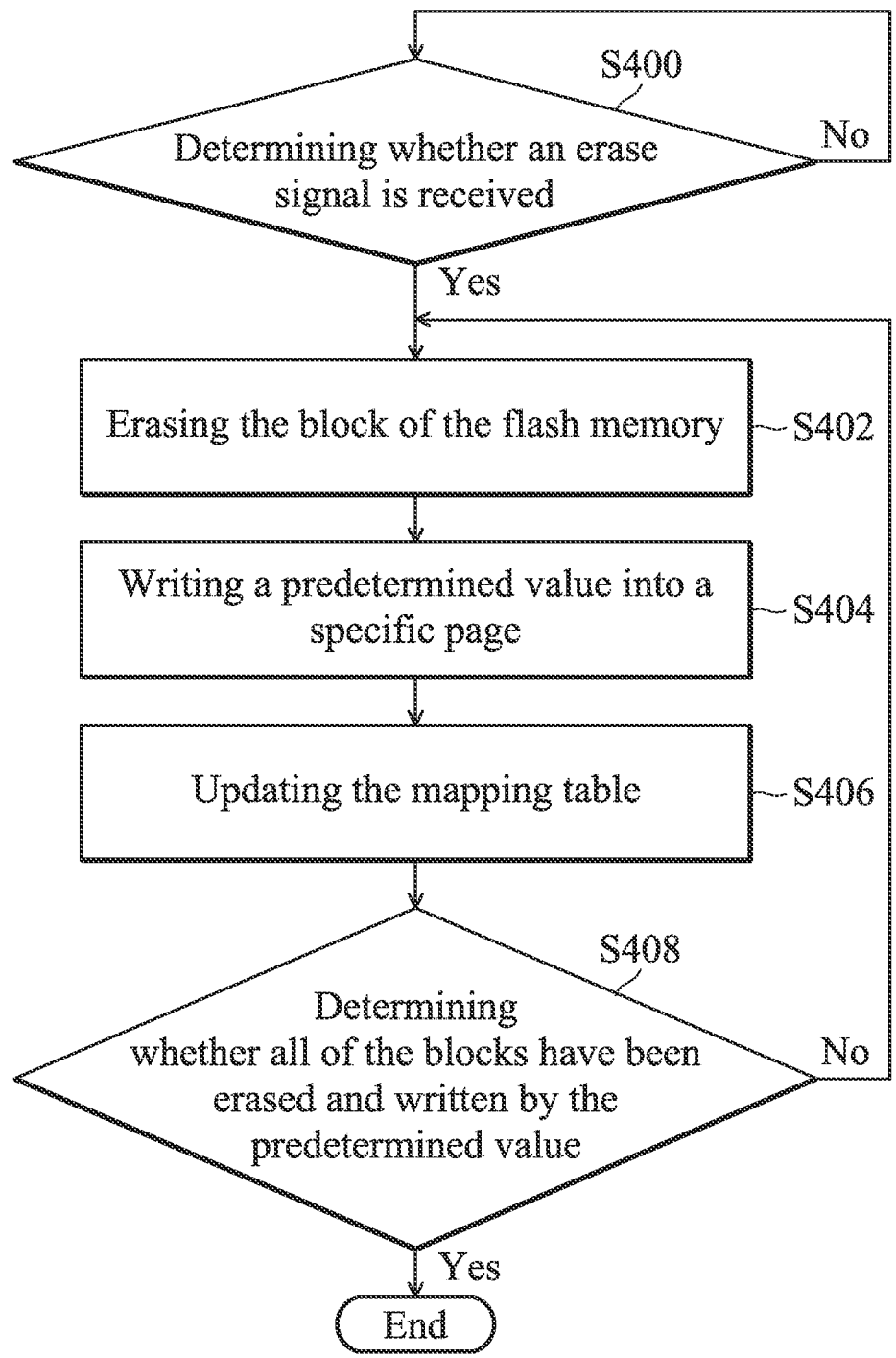
FIG. 4 is a flowchart of a data erasing method according to an embodiment of the present invention.

FIG. 4 is a flowchart of a data erasing method according to an embodiment of the present invention. The data erasing method is applied to the data-storage device 140 of FIG. 1. The process starts at step S400.

In step S400, the data-storage device 140 determines whether an erase signal is received. When the erase signal is received, the process goes to step S402, otherwise, the data-storage device 200 continues to check whether the erase signal is received. It should be noted that the erase signal may be a purge command, or an enhanced erase command specified by the ATA specification (Working Draft Project American National T13/2015-D Standard), but it is not limited thereto. In another embodiment of the present invention, the erase signal may be produced by a hardware switch.

In step S402, the controller 160 erases each of the pages of a block of the flash memory 180 for erasing the blocks of the flash memory 180. Namely, in step S402, the controller 160 starts to execute the erasing process on the blocks of the flash memory.

Next, in step S404, the controller 160 enables the flash memory 180 to write a predetermined value into a specific page of the block which has been erased in step S402. In one of the embodiments, the erase signal may further include a predetermined value arranged to be written to the flash memory 180. For example, the predetermined value can be "0x21", but it is not limited thereto.

Next, in step S406, the controller 160 rewrites the mapping table to map the logical addresses of all the pages of the block which has been erased in step S402 to the physical address of the specific page. For example, each of the pages of each of the blocks has a logical address and a physical address, and the data-storage device 140 further includes a mapping table arranged to store the corresponding relationships between the logical addresses and the physical addresses of the pages. Moreover, the mapping table may include at least one block mapping table and a plurality of page mapping tables. For example, the controller 160 may obtain the logical block and the logical page according to the corresponding logical address, and locate the physical block corresponding to the logical block according to the block mapping table. Next, the controller 160 may locate the physical page corresponding to the logical page according to the page mapping table corresponding to the logical block, but it is not limited thereto. The tables which are capable of locating the physical address of the logical address of pages are the scope of the present invention.

Next, in step S408, the controller 160 or the host 120 determines whether all of the blocks of the flash memory 180 have been erased and written by the predetermined value. If not, the process returns to step S402 and the controller 160 continues to erase the next block, otherwise the process ends at step S408.

The specific pages of all of the blocks have been written by the predetermined value and other pages of the blocks have been erased after the erasing process executed on the flash memory 180 is completed. Moreover, the logical addresses of all the pages of all the blocks in the mapping table are mapping to the physical address of the corresponding specific page of the corresponding block. Therefore, the host 120 may read the flash memory 180, and determine that the erasing process is completed according to the predetermined value read out from the pages of the flash memory 180. Namely, the data read out from each of the pages of each of the blocks are the predetermined value when the host 120 reads the flash memory 180 after the erasing process, therefore the flash memory 180 determines that the erasing process is completed. However, in the present invention, only the specific pages of the flash memory 180 have been written by the predetermined value. Therefore, the present invention shortens the time of the erasing process.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data-storage device, comprising:
a flash memory, comprising a plurality of blocks, wherein each of the plurality of blocks comprises a plurality of pages; and
a controller, arranged to receive an erase signal from a host, and enable the flash memory to execute an erasing process on at least one first block of the plurality of blocks in response to the erase signal, wherein the erase signal comprises a predetermined value that is different from 0xFF used in the erasing process, wherein in the erasing process executed on the first block, the controller erases each of the plurality of pages of the first block and also writes the predetermined value into a specific page of the first block after the first block is erased,
wherein each of the plurality of pages of each of the plurality of blocks has a logical address and a physical address, and the data-storage device further comprises at least one mapping table arranged to store the corresponding relationships between the logical addresses and the physical addresses of the plurality of pages, wherein the logical addresses of all the plurality of pages of the first block are mapped to the physical address of the specific page of the first block in the mapping table, such that data read out from either of the logical addresses corresponding to the plurality of pages of the first block is the predetermined value, wherein the host determines that the erasing process executed on the first block is completed based upon reading the predetermined value from either of the logical addresses corresponding to the plurality of pages of the first block.

2. The data-storage device as claimed in claim 1, wherein the erase signal is produced by a hardware switch.

3. The data-storage device as claimed in claim 1, wherein the erase signal is a purge command.

4. The data-storage device as claimed in claim 1, wherein the erase signal is an enhanced erase command.

5. The data-storage device as claimed in claim 1, wherein the predetermined value is a hexadecimal value of 0x21.

6. The data-storage device as claimed in claim 1, wherein the controller only writes the predetermined value into the specific page of the first block.

7. A data erasing method, applied to a data-storage device, wherein the data-storage device comprises a flash memory, the flash memory comprises a plurality of blocks, and the data erasing method comprises:
executing an erasing process on the first block in response to an erase signal, wherein the erase signal comprises a predetermined value that is different from 0xFF used in the erasing process;
erasing each of pages of the first block and also writing the predetermined value into a specific page of the first block after the first block is erased in the erasing process, wherein each of the pages of the first block has a logical address and a physical address, and the data-storage device further comprises at least one mapping table arranged to store the corresponding relationships between the logical addresses and the physical addresses of the pages;
updating the mapping table to map the logical addresses of all the pages of the first block to the physical address of the specific page of the first block, such that data read out from either of the logical addresses corresponding to the pages of the first block is the predetermined value; and
determining that the erasing process executed on the first block is completed based upon reading the predetermined value from either of the pages of the first block.

8. The data erasing method as claimed in claim 7, further comprising repeating the steps of erasing data of other blocks within the plurality of blocks, writing the predetermined value and updating the mapping table until all of the plurality of blocks of the flash memory are erased.

9. The data erasing method as claimed in claim 7, wherein the erase signal is produced by a hardware switch.

10. The data erasing method as claimed in claim 7, wherein the erase signal is a purge command.

11. The data erasing method as claimed in claim 7, wherein the erase signal is an enhanced erase command.

12. The data erasing method as claimed in claim 7, wherein the predetermined value is a hexadecimal value of 0x21.

13. The data erasing method as claimed in claim 7, wherein the predetermined value is only written into the specific page of the first block.

* * * * *